United States Patent
Eguchi et al.

(10) Patent No.: US 12,431,200 B2
(45) Date of Patent: Sep. 30, 2025

(54) MEMORY SYSTEM AND CONTROL METHOD TO SAVE DATA AFTER A POWER DISABLE REQUEST

(71) Applicant: Kioxia Corporation, Tokyo (JP)

(72) Inventors: Yohei Eguchi, Yokohama Kanagawa (JP); Naoki Kimura, Ebina Kanagawa (JP)

(73) Assignee: Kioxia Corporation, Tokyo (JP)

( * ) Notice: Subject to any disclaimer, the term of this patent is extended or adjusted under 35 U.S.C. 154(b) by 133 days.

(21) Appl. No.: 18/179,310

(22) Filed: Mar. 6, 2023

(65) Prior Publication Data

US 2024/0087657 A1   Mar. 14, 2024

(30) Foreign Application Priority Data

Sep. 14, 2022   (JP) .................................. 2022-146033

(51) Int. Cl.
 *G11C 16/04* (2006.01)
 *G11C 16/30* (2006.01)

(52) U.S. Cl.
 CPC .......... *G11C 16/30* (2013.01); *G11C 16/0483* (2013.01)

(58) Field of Classification Search
 CPC ........ G11C 16/30; G11C 16/0483; G11C 5/14
 USPC .................................................... 365/185.17
 See application file for complete search history.

(56) References Cited

U.S. PATENT DOCUMENTS

| | | | |
|---|---|---|---|
| 9,286,985 B2 * | 3/2016 | Kimura | G06F 3/0685 |
| 10,551,897 B2 | 2/2020 | Loewen et al. | |
| 10,955,891 B2 * | 3/2021 | Nam | G06F 1/3296 |
| 11,257,548 B2 * | 2/2022 | Kimura | H02H 3/20 |
| 11,495,320 B2 * | 11/2022 | Kim | G11C 16/30 |
| 11,656,770 B2 * | 5/2023 | Olarig | G06F 1/3268 |
| | | | 711/154 |
| 2020/0411068 A1 | 12/2020 | Rowley | |
| 2021/0318815 A1 | 10/2021 | Olarig et al. | |

* cited by examiner

*Primary Examiner* — Tha-O H Bui
(74) *Attorney, Agent, or Firm* — Kim & Stewart LLP (57) ABSTRACT

According to one embodiment, a memory system includes a nonvolatile memory to store data, a memory controller configured to perform data operations on the nonvolatile member, and a power circuit configured to receive external power and generate internal power to be supplied to the nonvolatile memory and the memory controller. The memory controller is further configured to receive a request signal for disabling supply of the internal power for a first time period and disable the supply of the internal power from the power circuit in response to the request signal after a second time period elapses after reception of the request signal. The second time period is shorter than the first time period. The supply of the internal power from the power circuit resumes after the first time period elapses after the reception of the request signal.

20 Claims, 6 Drawing Sheets

MEMORY SYSTEM AND CONTROL METHOD TO SAVE DATA AFTER A POWER DISABLE REQUEST

CROSS-REFERENCE TO RELATED APPLICATION

This application is based upon and claims the benefit of priority from Japanese Patent Application No. 2022-146033, filed Sep. 14, 2022, the entire contents of which are incorporated herein by reference.

FIELD

Embodiments described herein relate generally to a memory system and a control method for a memory system.

BACKGROUND

PCI Express (PCIe) and Non-Volatile Memory Express (NVMe) are known interface standards for memory systems such as an solid-state disk (SSD) memory. NVMe is a protocol standard for storage devices using nonvolatile memory.

The PCIe standard defines a power disable signal (hereinafter, referred to as a power disable (PWRDIS) signal). The PWRDIS signal is a request signal for turning off the output of a power management IC (PMIC) in a memory system for a predetermined time. For example, a PWRDIS signal is used to temporarily turn off the power in the memory system while continuing to supply power from a host to restart an SSD memory system.

When restarting the SSD memory system after a PWRDIS signal is sent from the host, a memory controller also needs to respond to the reception of the PWRDIS signal. If the PWRDIS signal sent from the host is directly supplied to the PMIC, and the PMIC performs control to turn off the power output according to the PWRDIS signal, the memory controller may be unable to save the data and is put into an unexpected shutdown state. This causes data loss in the memory system.

DETAILED DESCRIPTION

Embodiments provide a memory system that is able to save data after receiving a request for disabling power supply.

In general, according to one embodiment, a memory system includes a nonvolatile memory to store data, a memory controller configured to perform data operations on the nonvolatile member, and a power circuit configured to receive external power and generate internal power to be supplied to the nonvolatile memory and the memory controller. The memory controller is further configured to receive a request signal for disabling supply of the internal power for a first time period and disable the supply of the internal power from the power circuit in response to the request signal after a second time period elapses after reception of the request signal. The second time period is shorter than the first time period. The supply of the internal power from the power circuit resumes after the first time period elapses after the reception of the request signal.

First Embodiment

Figure 1:
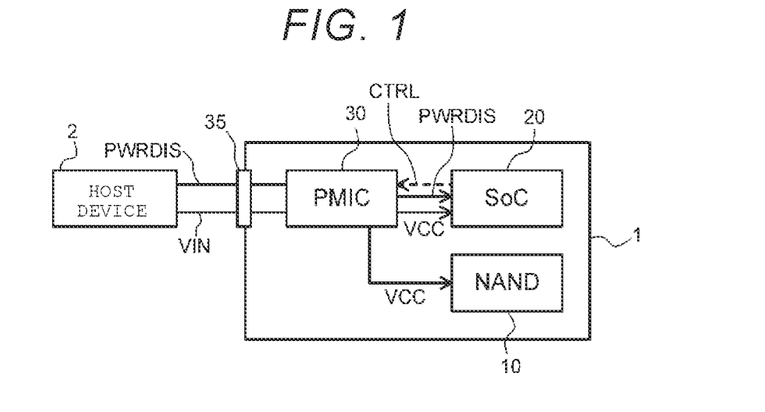
FIG. 1 is a block diagram showing an overview of an information processing system including a memory system and a host device according to a first embodiment.

FIG. 1 is a block diagram showing an overview of an information processing system including a memory system 1 and a host device 2 of a first embodiment. As shown in FIG. 1, the memory system 1 can be connected to the host device 2. The memory system 1 is, for example, a solid-state drive (SSD) or a universal flash storage (UFS) device. The host device 2 is, for example, a server, a personal computer, an in-vehicle device, or a mobile information processing device. The memory system 1 functions as an external storage device for the host device 2. The host device 2 may issue requests to the memory system 1. Requests include read requests and write requests by which data is read from or written to the memory system 1.

For example, the memory system 1 includes a power circuit 30 configured with a NAND flash memory 10 (also referred to as a NAND memory 10 in the following), a memory controller 20 (also may be referred to as system-on-a-chip (SoC) 20 in the following), a power management integrated circuit (PMIC) 30 (also may be referred to as a power circuit 30 in the following), and the like. The NAND memory 10 includes one or more memory chips. A memory chip includes a plurality of memory cell transistors and may store data in a nonvolatile manner. Each memory chip of the NAND memory 10 is connected to the memory controller 20.

The memory controller 20 performs program (write) processing, read processing, erase processing, and the like on the NAND memory 10. The memory controller 20 is a semiconductor circuit configured as SoC in this example. The memory controller 20 may be configured as a field programmable gate array (FPGA) or an application specific integrated circuit (ASIC). The memory controller 20 may be configured with two or more chips. Each function of the memory controller 20 may be implemented by a processor executing software (e.g., firmware), dedicated hardware, or a combination thereof.

The power circuit 30 supplies power to each circuit element provided in the memory system 1 (such as the NAND memory 10 and the memory controller 20). The power circuit 30 in this example is a PMIC, other circuit designs may be adopted in other examples. The power circuit 30 receives the supply of a power VIN (first power or external power) from the outside of the host device 2 or at least outside the memory system 1 via the connector 35 and generates one or more constant voltages. The power circuit 30 generates and supplies a constant-voltage power VCC (second power or internal power) corresponding to a plurality of supply destinations (Ch*). The plurality of supply destinations are, for example, the NAND memory 10 and the memory controller 20.

The power circuit 30 also receives a PWRDIS signal from the host device 2 via the connector 35. The PWRDIS signal is a request signal from the host device 2 to disable the power supply by the memory system 1 for a predetermined time. The PWRDIS signal is, for example, a signal that remains High (H) for 5 seconds. However, when the power circuit 30 controls the on/off of the power VCC according to the PWRDIS signal, unintended data loss may occur in the NAND memory 10.

Therefore, in the memory system 1 of the present embodiment, upon receiving a PWRDIS signal, the memory controller 20 transmits a control signal CTRL to the power circuit 30 for delaying the turning off the power VCC. With such a configuration, the memory controller 20 and the NAND memory 10 may obtain the time necessary to save data and thus avoid unintended data loss.

Figure 2:
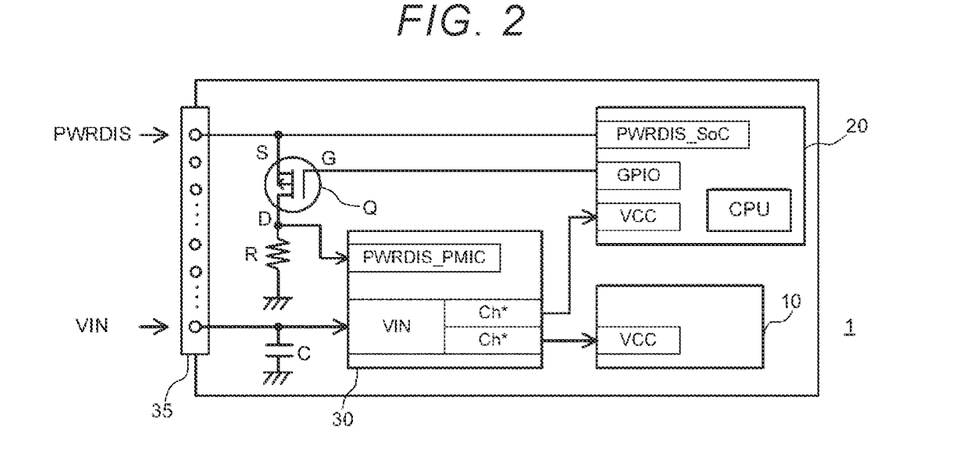
FIG. 2 is a circuit configuration diagram showing a configuration of a memory system according to a first embodiment.

FIG. 2 is a circuit configuration diagram showing in more detail the configuration of the memory system 1 according to the first embodiment. As shown in FIG. 2, the memory system 1 of the first embodiment receives the power VIN and the PWRDIS signal via the connector 35. A signal line for the PWRDIS signal is also connected to the corresponding input terminal PWRDIS_SoC of the memory controller 20. As noted, this PWRDIS signal is a request signal from the host device 2 sent to the memory system 1 to turn off the power VCC being output of the power circuit 30 for some predetermined period (referred to as a first period).

The signal line of the PWRDIS signal is also connected to the corresponding input terminal PWRDIS_PMIC of the power circuit 30 via a switching element Q.

In the example shown in FIG. 2, the switching element Q is a P-MOSFET, but is not limited thereto. The switching element Q may be an N-MOSFET in other examples. The source of the switching element Q is connected to the signal line of the PWRDIS signal, and the drain of the switching element Q is connected, via the resistor R, to the ground. The gate of the switching element Q is connected to a general-purpose input/output terminal (referred to as a GPIO terminal) as a terminal from which the control signal CTRL from the memory controller 20 is output. The drain terminal of the switching element Q is connected to the input terminal PWRDIS_PMIC of the power circuit 30 for the PWRDIS signal.

The power VIN received via the connector 35 is connected to the input terminal VIN of the power circuit 30. The connection line of the power VIN is bypassed by the capacitor C to the ground.

The power circuit 30 generates a power VCC to be supplied to the NAND memory 10 and the memory controller 20 based on the applied power VIN. The power circuit 30 shown in FIG. 2 includes a PWRDIS_PMIC terminal that receives the PWRDIS signal. When the input terminal PWRDIS_PMIC of the power circuit 30 receives the PWRDIS signal, the output of the power VCC is controlled to be off for a predetermined period according to the PWRDIS signal.

In the memory system 1 of this first embodiment, the memory controller 20 includes the PWRDIS_SoC terminal that also receives the PWRDIS signal, the general-purpose input/output terminal GPIO, a VCC terminal that receives the power VCC, a processor (CPU) that controls the output of the control signal CTRL, and the like. The NAND memory 10 also includes a VCC terminal for receiving power VCC.

Next, the operation of the memory system of the first embodiment will be described with reference to FIGS. 3 and 4.

Figure 3:
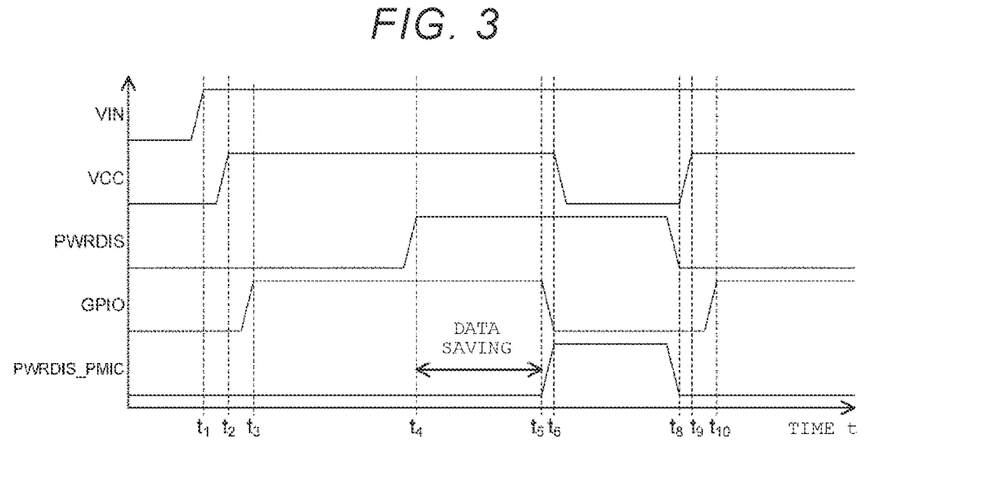
FIG. 3 is a timing chart showing operations of a memory system according to a first embodiment.
Figure 4:
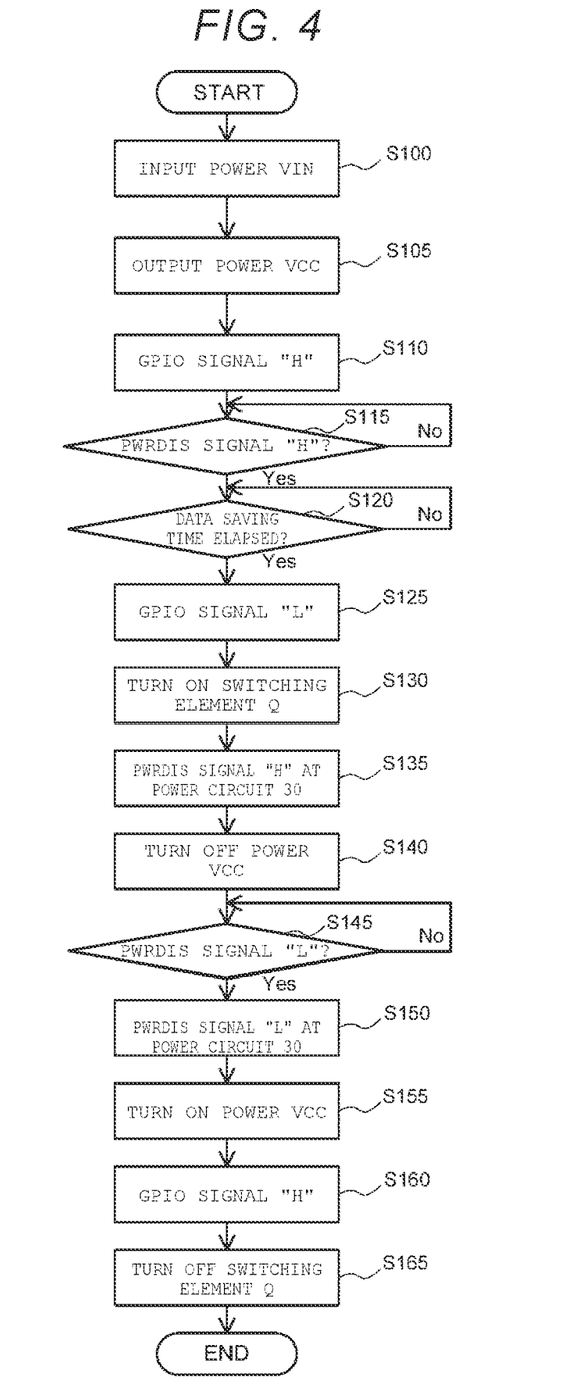
FIG. 4 is a flow chart showing operations of a memory system according to a first embodiment.

FIG. 3 is a timing chart with respect to the voltage level of the power VIN supplied to the power circuit 30, the voltage level of the power VCC output from the power circuit 30, the voltage level of the PWRDIS signal sent from the host device 2, the voltage level of the general-purpose input/output terminal GPIO of the memory controller 20, and the voltage level of the PWRDIS_PMIC terminal of the power circuit 30 over time (time t). FIG. 4 is a flow chart for explaining operations of the memory system 1.

As shown in FIG. 3, when power circuit 30 receives the power VIN via the connector 35 at time t1 (also S100 in FIG. 4), the power VIN is at a predetermined voltage level. The power circuit 30 generates the power VCC corresponding to each Ch* at time t2 (S105 in FIG. 4) in response to the supply of the power VIN.

As shown in FIG. 3, in the initial state, the host device 2 is not transmitting the PWRDIS signal, and the voltage level of the PWRDIS signal is thus a low level ("L") at time t2. Therefore, the power circuit 30 supplies the generated power VCC to the memory controller 20 and the NAND memory 10 (S105).

The processor (CPU) of the memory controller 20 performs an initialization operation upon beginning to receive the supply of the power VCC, and changes the voltage level of the general-purpose input/output terminal GPIO to a high level ("H") at time t3 (S110). Thereafter, the memory controller 20 begins to wait for reception of a "H" PWRDIS signal (No in S115).

When the host device 2 eventually changes the level of the PWRDIS signal to "H" at time t4 and the level of the PWRDIS_SoC terminal of the memory controller 20 becomes "H" (Yes in S115), the memory controller 20 maintains the level of the general-purpose input/output terminal GPIO at "H" until the writing of the data still to be processed in the NAND memory 10 has been completed (the data saving time is finished or elapsed) (No in S120). In the example shown in FIG. 3, the voltage level of the general-purpose input/output terminal GPIO is maintained at "H" until time t5 when the data saving time is finished/elapsed. The memory controller 20 may perform processing such as write operation, flash processing, and saving of not-stored data of the NAND memory 10 during the data saving time.

The data saving time (also referred to as a second period) from time t4 to time t5 can be freely set, but generally should not exceed 5 seconds, which is a minimum value defined for the PWRDIS signal. The data saving time may be set by design in advance based on the expected or known time required for a write operation of the NAND memory 10 or the like to complete. Such a value may be experimentally determined by actual measurement or may be estimated. As shown in FIG. 3, the data saving time period (second period) is shorter than the period for turning off the power VCC (first period) required by the PWRDIS signal.

When the data saving time elapses at time t5 (Yes in S120), the processor (CPU) of the memory controller 20 changes the level of the general-purpose input/output terminal GPIO to "L" at time t6 (S125).

When the level of the general-purpose input/output terminal GPIO changes from "H" to "L" at time t6, since the switching element Q in FIG. 2 is now turned on (S130), the voltage of the PWRDIS_PMIC terminal becomes "H" from "L" (S135), and the voltage becomes the same as that of the PWRDIS_SoC terminal.

At time t6, the power circuit 30 turns off the output of the power VCC according to the definition of the PWRDIS signal (S140). That is, the supply of the power VCC is now disabled. At this time, since the supply of the power VCC to the memory controller 20 is stopped, the level of the general-purpose input/output terminal GPIO is maintained at "L".

Since the level of the general-purpose input/output terminal GPIO is at "L" and the switching element Q is thus maintained to be on, when the level of the PWRDIS signal becomes "L" at time t8 (Yes in S145), the level of the PWRDIS_PMIC terminal of the power circuit 30 becomes a low level "L" (S150).

The power circuit 30 turns on the output of the power VCC at time t9 according to the change of the PWRDIS signal (S155). That is, the supply of power VCC is resumed.

The memory controller 20 performs an initialization operation when the power VCC is supplied again, and the processor (CPU) of the memory controller 20 sets the level of the general-purpose input/output terminal GPIO to "H" at time t10 (S160), turns off the switching element Q (S165), and monitors the level of the PWRDIS_SoC terminal.

According to this first embodiment, upon detecting a change in the PWRDIS signal, the memory controller 20 transmits the level of the PWRDIS signal to the power circuit 30 via the switching element Q after the data saving time in the NAND memory 10 elapses. That is, when the host device 2, the memory controller 20, and the power circuit 30 correspond to the PWRDIS signal, the data saving time can be secured with a simple configuration.

Second Embodiment

Next, a memory system according to a second embodiment will be described with reference to FIG. 5. A memory system 1a of this second embodiment is configured such that a memory controller 21 directly controls the transmission of the PWRDIS signal to a power circuit 31. In the following description, elements and operations common to those of the first embodiment are denoted by the same reference numerals, and overlapping description may be omitted.

Figure 5:
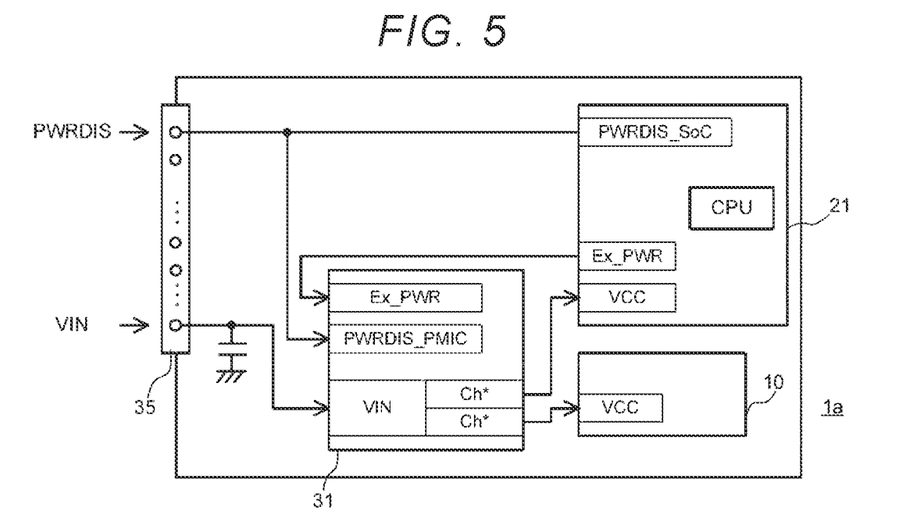
FIG. 5 is a circuit configuration diagram showing a configuration of a memory system according to a second embodiment.

As shown in FIG. 5, the memory system 1a of this second embodiment receives a power VIN and a PWRDIS signal via a connector 35. A signal line for the PWRDIS signal is connected to the corresponding input terminal PWRDIS_SoC of the memory controller 21. Similarly, the signal line for the PWRDIS signal is also connected to the corresponding input terminal PWRDIS_PMIC of the power circuit 31.

In the memory system 1a of this embodiment, the memory controller 21 includes the input terminal PWRDIS_SoC that receives the PWRDIS signal, an output terminal Ex_PWR as a terminal for a control signal CTRL that controls external power supply, a VCC terminal that receives power VCC, a processor (CPU) that controls the output of an Ex_PWR terminal, and the like. The NAND memory 10 also includes a VCC terminal for receiving power VCC.

The power circuit 31 shown in FIG. 5 includes the input terminal PWRDIS_PMIC that receives the PWRDIS signal. The power circuit 31 also includes an input terminal Ex_PWR that enables control of the output of the power VCC.

Next, the operation of the memory system 1a of the second embodiment will be described with reference to FIGS. 6 and 7.

Figure 6:
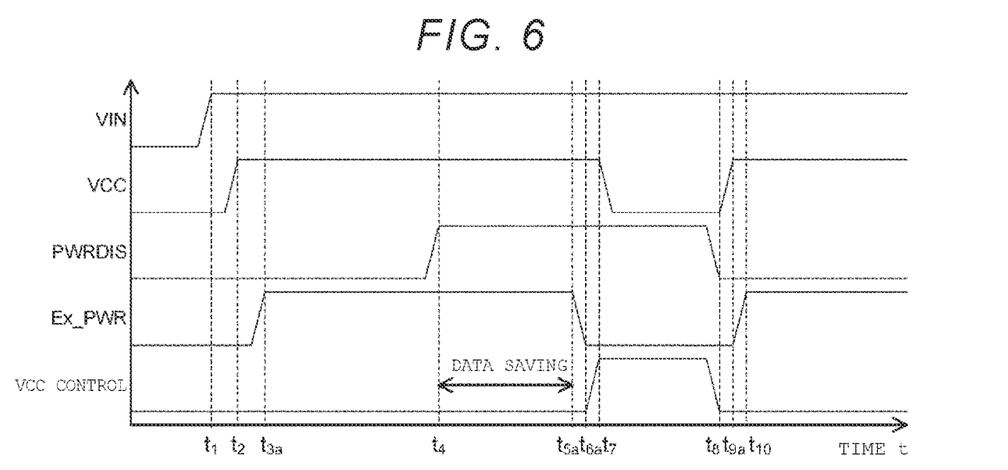
FIG. 6 is a timing chart showing operations of a memory system according to a second embodiment.
Figure 7:
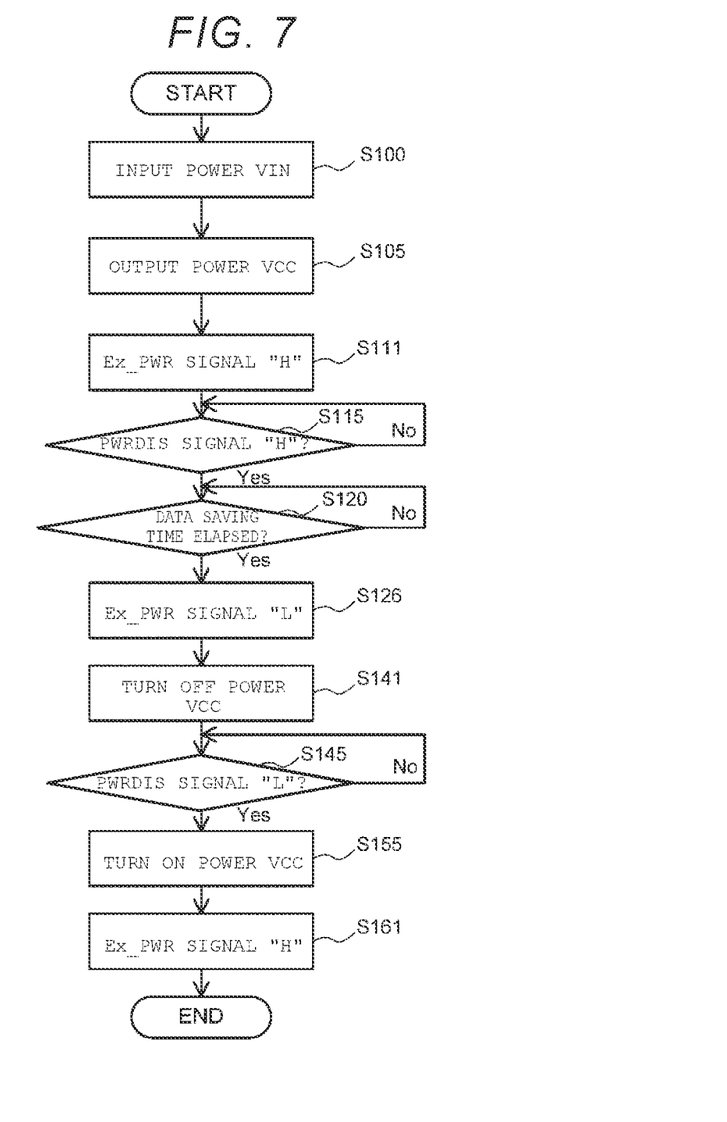
FIG. 7 is a flow chart showing operations of a memory system according to a second embodiment.

FIG. 6 is a timing chart with respect to the voltage level of the power VIN supplied to the power circuit 31, the voltage level of the power VCC output from the power circuit 31, the voltage level of the PWRDIS signal sent from the host device 2, the voltage level of the output terminal Ex_PWR of the memory controller 21 controlling the external power, and the control state of the power VCC over time (time t). FIG. 7 is a flow chart showing the operations of the memory system 1a.

As shown in FIG. 6, when the power circuit 31 receives the power VIN via the connector 35 at time t1, the power VIN is at a predetermined voltage level. The power circuit 31 generates the power VCC corresponding to each Ch* at time t2 in response to the supply of the power VIN (S100 in FIG. 7).

As shown in FIG. 6, in the initial state, the host device 2 is not transmitting the PWRDIS signal, and the voltage level of the PWRDIS signal is "L" at time t2. Therefore, the power circuit 31 supplies the generated power VCC to the memory controller 21 and the NAND memory 10 (S105).

The processor (CPU) of the memory controller 21 performs an initialization operation upon receiving the supply of the power VCC, and changes the signal of the output terminal Ex_PWR to a high level "H" at time t3a (S111). Thereafter, the memory controller 21 waits for reception of the "H" PWRDIS signal (No in S115).

When the host device 2 sets the PWRDIS signal to "H" at time t4 and the level of the PWRDIS_SoC terminal of the memory controller 21 becomes "H" (Yes in S115), the memory controller 21 maintains the level of the output terminal Ex_PWR at "H" until the writing of the data still to be processed in the NAND memory 10 is completed (data saving time finishes/elapses) (No in S120). In the example shown in FIG. 6, the voltage level of the output terminal Ex_PWR is maintained at "H" until time t5a. The memory controller 21 may perform processing such as write operations, flash processing, and saving of any not-stored data of the NAND memory 10 during the data saving time.

In the second embodiment, the power circuit 31 monitors the level of the PWRDIS signal and the level of the input terminal Ex_PWR, and when the level of the PWRDIS_PMIC terminal is "H" and the level of the input terminal Ex_PWR is "L", the power circuit 31 controls the output of the power VCC from on to off.

When the data saving time from time t4 to time t5a elapses (Yes in S120), the CPU of the memory controller 21 changes the level of the output terminal Ex_PWR from "H" to "L" at time t6a (S126).

When the level of the output terminal Ex_PWR of the memory controller 21 is "L", that is, when the level of the input terminal Ex_PWR of the power circuit 31 is "L", the level of the PWRDIS_PMIC terminal is "H". As a result, the power circuit 31 controls the output of the power VCC from on to off at time t7 (S141). That is, the supply of the power VCC is disabled.

The power circuit 31 turns on the output of the power VCC at time t9a in response to the change in the level of PWRDIS_PMIC at time t8 (Yes in S145) (S155). That is, the supply of power VCC is resumed.

The memory controller 21 performs an initialization operation when the power VCC is supplied again, and the CPU of the memory controller 21 changes the level of the output terminal Ex_PWR to "H" at time t10 (S161).

According to this second embodiment, upon detecting a change in the PWRDIS signal, the memory controller 21 transmits the level of the Ex_PWR signal for directly controlling the output of the power VCC to the power circuit 31, but only after the data saving time in the NAND memory 10 elapses. It is thus possible to provide the data saving time as necessary with a simple configuration without adding an external circuit or the like.

Third Embodiment

Next, a memory system according to a third embodiment will be described with reference to FIG. 8. A memory system 1*b* of this third embodiment realizes transmission control of a PWRDIS signal to a power circuit 32 by using a power loss notification (PLN) signal and a power loss acknowledge (PLA) signal. In the following description, elements and operations common to those of the first embodiment and the second embodiment are denoted by the same reference numerals, and overlapping description is omitted.

Figure 8:
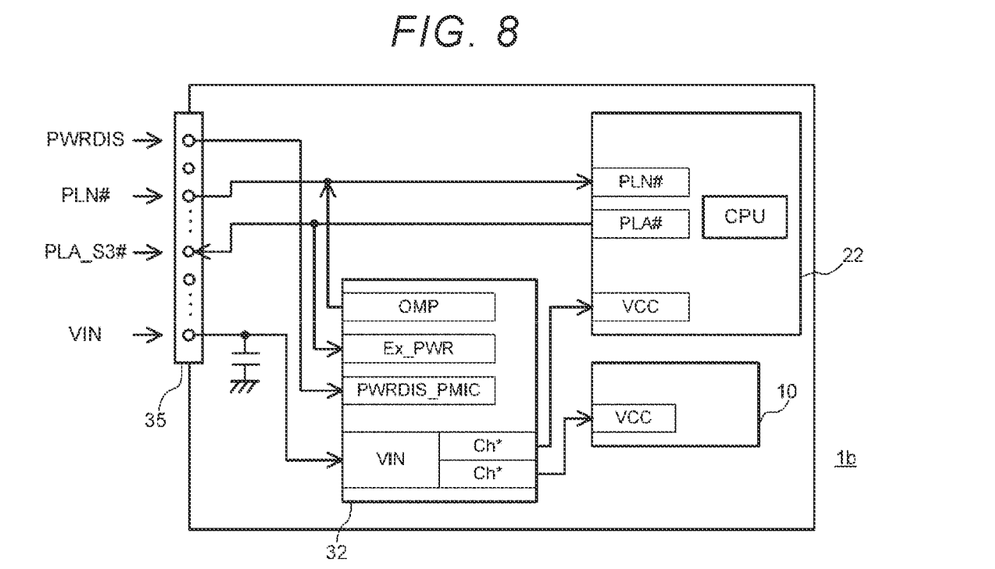
FIG. 8 is a circuit configuration diagram showing a configuration of a memory system according to a third embodiment.

As shown in FIG. 8, the memory system 1*b* of this third embodiment receives a power VIN and a PWRDIS signal via a connector 35. A signal line for the PWRDIS signal is connected to the corresponding input terminal PWRDIS_PMIC of the power circuit 32.

In the memory system 1*b*, a memory controller 22 includes a PLN terminal that receives the PLN signal, a PLA terminal that transmits the PLA signal (as a control signal CTRL), a VCC terminal that receives power VCC, a processor (CPU) that controls aspects related to the PLN signal and the PLA signal, and the like. The NAND memory 10 also includes a VCC terminal for receiving a power VCC.

The PLN terminal realizes the function of notifying of loss of power. The PLA terminal realizes the function of returning an acknowledge signal in response to the signal input to the PLN terminal.

The power circuit 32 shown in FIG. 8 includes the PWRDIS_PMIC terminal that receives the PWRDIS signal. The power circuit 32 also has an input terminal Ex_PWR that enables control of the output of the power VCC. Furthermore, the power circuit 32 includes an OMP terminal (OMP: Off Module Power Loss Protection) that may send a power loss protection signal.

Next, operations of the memory system 1*b* of the third embodiment will be described with reference to FIGS. 9 and 10.

Figure 9:
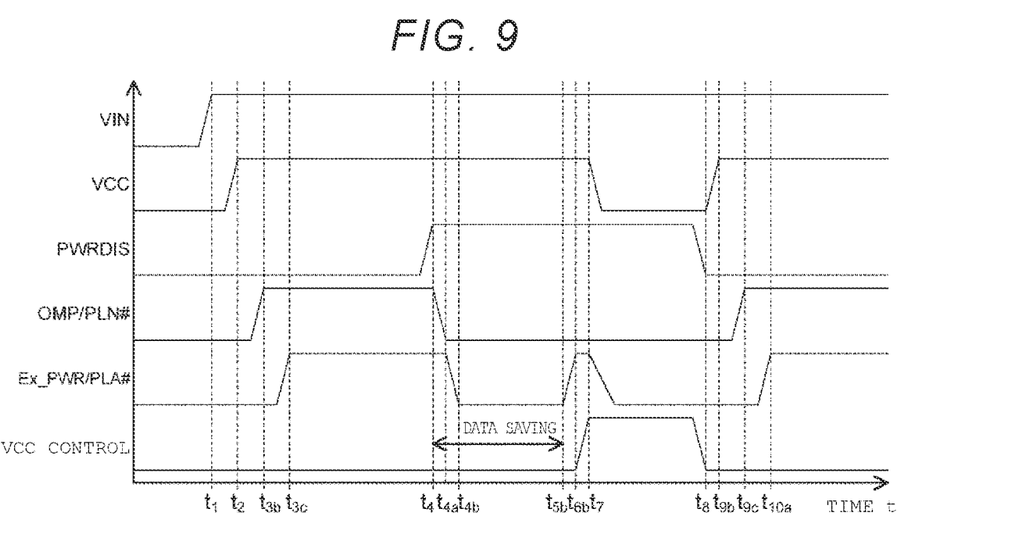
FIG. 9 is a timing chart showing operations of a memory system according to a third embodiment.
Figure 10:
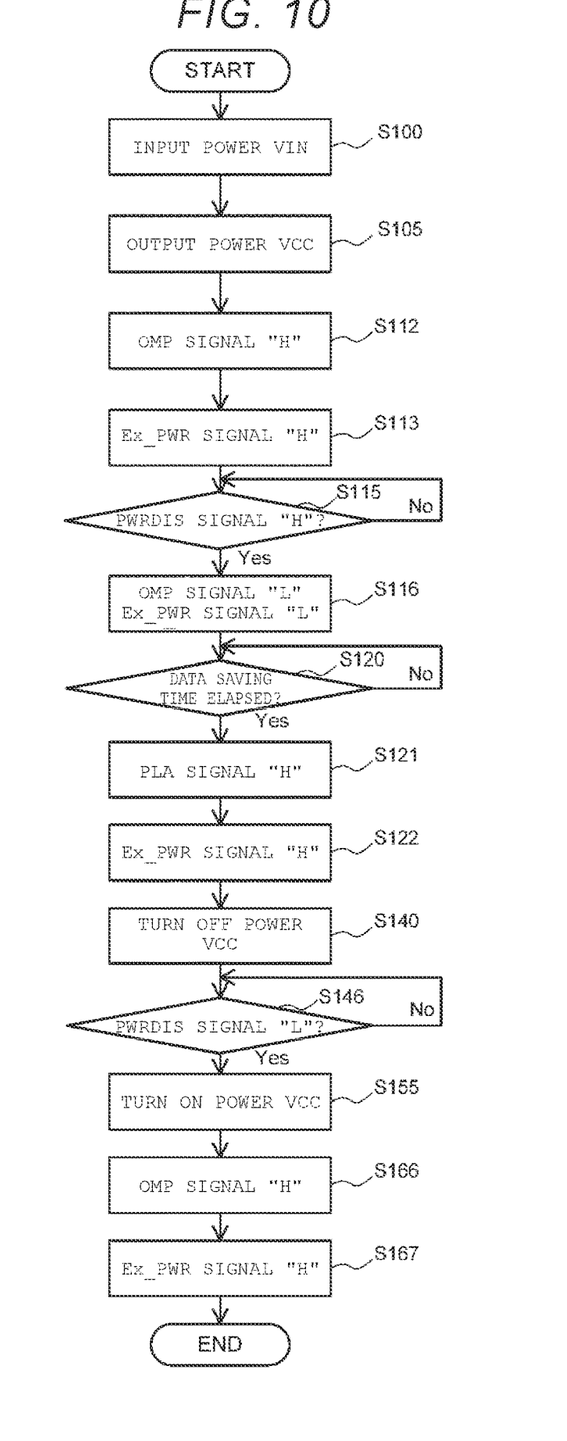
FIG. 10 is a flow chart showing operations of a memory system according to a third embodiment.

FIG. 9 is a timing chart respect to the voltage level of the power VIN supplied to the power circuit 32, the voltage level of the power VCC output from the power circuit 32, the voltage level of the PWRDIS signal sent from the host device 2, the voltage level at the OMP terminal (the PLN terminal of the memory controller 22) of the power circuit 32, the voltage level at the input terminal Ex_PWR (the PLA terminal of the memory controller 22) of the power circuit 32, and the control state of the power VCC over time (time t). FIG. 10 is a flow chart showing the operations of the memory system 1*b*.

As shown in FIG. 9, when the power circuit 32 receives the power VIN via the connector 35 at time t1, the power VIN is at a predetermined voltage level. The power circuit 32 generates the power VCC corresponding to each Ch* at time t2 in response to the supply of the power VIN (S100 in FIG. 10).

As shown in FIG. 9, in the initial state, the host device 2 does not transmit the PWRDIS signal, and the voltage level of the PWRDIS signal is "L" at time t2. Therefore, the power circuit 32 supplies the generated power VCC to the memory controller 22 and the NAND memory 10 (S105).

Upon receiving the power VIN, the power circuit 32 changes the level of the OMP terminal to "H" at time t3*b* (S112). Since the OMP terminal of the power circuit 32 is connected to the PLN terminal of the memory controller 22, the level of the PLN terminal becomes "H". Upon receiving the power VCC, the CPU of the memory controller 22 performs an initialization operation, sets the PLN terminal to an input mode, and at time t3*c*, changes the PLA terminal to "H" level in an output mode. Since the PLA terminal of the memory controller 22 is connected to the Ex_PWR terminal of the power circuit 32, the level of the Ex_PWR terminal also becomes "H" (S113). Thereafter, the power circuit 32 waits for reception of the PWRDIS signal (No in S115).

In this third embodiment, the power circuit 32 monitors the level of the PWRDIS signal and the level of the input terminal Ex_PWR, and when the level of the PWRDIS_PMIC terminal is "H" and the level of the input terminal Ex_PWR is changed from "L" to "H", the power circuit 32 controls the output of the power VCC from on to off.

When the host device 2 changes the PWRDIS signal to "H" at time t4 and the level of the PWRDIS_PMIC terminal of the power circuit 32 changes to "H" (Yes in S115), the power circuit 32 changes the level of the OPM terminal to "L" at time t4*a*. Since the OPM terminal is connected to the PLN terminal, when the level of the OPM terminal becomes "L", the level of the PLN terminal also becomes "L". According to the operation programmed in the memory controller 22, when writing of the data still to be processed in the NAND memory 10 is started (data saving), the level of the PLA terminal is changed to "L" at time t4*b*, and the Ex_PWR terminal of the power circuit 32 also becomes "L" (S116).

The memory controller 22 changes the level of the PLA terminal to "L" and maintains the level of the Ex_PWR terminal at "L" until the writing of the data to be processed in the NAND memory 10 is completed (data saving time) (No in S120). In the example shown in FIG. 9, the voltage level of the Ex_PWR terminal is maintained at "L" until time t5*b*. The memory controller 22 may perform processing such as write operation, flash processing, and saving of not-stored data of the NAND memory 10 during the data saving time.

When the data saving time from time t4 to time t5*b* elapses (Yes in S120), the CPU of the memory controller 22 temporarily changes the level of the PLA terminal from "L" to "H" during the period from time t6*b* to time t7 (S121). As a result, the level of the input terminal Ex_PWR of the power circuit 32 also changes from "L" to "H" (S122).

When the level of the input terminal Ex_PWR of the power circuit 32 becomes "H", the level of the PWRDIS_PMIC terminal is "H". As a result, the power circuit 32 controls the output of the power VCC from on to off at time t7 (S140). That is, the supply of the power VCC is disabled.

The power circuit 32 monitors the level of the PWRDIS_PMIC terminal (No in S146). When the level of the PWRDIS_PMIC terminal changes from "H" to "L" at time t8 (Yes in S146), the power circuit 32 turns on the output of the power VCC at time t9*b* (S155), and changes the level of the OMP terminal to "H" from "L" at time t9*c* (S166). Since the OMP terminal of the power circuit 32 is connected to the PLN terminal of the memory controller 22, the level of the PLN terminal becomes "H". The CPU of memory controller 22 performs an initialization operation upon receiving power VCC at time t9b, and at time t10a sets the PLN terminal to the input mode and the PLA terminal to the "H" level in the output mode. Since the PLA terminal of the memory controller 22 is connected to the Ex_PWR terminal of the power circuit 32, the level of the Ex_PWR terminal also becomes "H" (S167).

According to this third embodiment, since the output of the power VCC can be controlled by using an existing PLN terminal and a PLA terminal, the data saving time can be provided with a simple configuration without adding an external circuit or the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
    a nonvolatile memory to store data;
    a memory controller configured to perform data operations on the nonvolatile memory;
    a power circuit configured to receive external power and generate internal power to be supplied to the nonvolatile memory and the memory controller;
    an input connector connectable to a host device;
    a power input line connecting the input connector to the power circuit;
    a first internal power line connecting the power circuit to the nonvolatile memory;
    a first signal line connecting the input connector to the memory controller and the power circuit, wherein
    the memory controller is further configured to:
        receive, via the first signal line, a request signal for disabling supply of the internal power for a first time period, and
        disable the supply of the internal power from the power circuit in response to the request signal after a second time period elapses after reception of the request signal, the second time period being shorter than the first time period, and
    the supply of the internal power from the power circuit resumes after the first time period elapses after the reception of the request signal.

2. The memory system according to claim 1, further comprising:
    a switching element that opens and closes a portion of the first signal line in response to a control signal from the memory controller, the portion connecting the input connector to the power circuit, wherein
    the memory controller causes the switching element to be open in an initial state before the reception of the request signal and causes the switching element to close after the second time period elapses after the reception of the request signal.

3. The memory system according to claim 2, wherein
    a conductive channel of the switching element is on the portion of the first signal line, and
    a control gate of the switching element is connected to the memory controller via an internal signal line.

4. The memory system according to claim 1, wherein the memory controller saves data during the second time period.

5. The memory system according to claim 1, further comprising:
    a second signal line connecting the memory controller to the power circuit, wherein
    the memory controller is configured to transmit a disable signal, via the second signal line, to the power circuit once the second period elapses after the reception of the request signal, and
    the power circuit is configured to disable the supply of the internal power upon receiving the disable signal.

6. The memory system according to claim 1, wherein
    the memory controller and the power circuit are each connected via the first signal line to a PWRDIS terminal of the input connector receiving the request signal,
    the memory controller is configured to transmit a disable signal to the power circuit after the second period elapses after the reception of the request signal, and
    the power circuit is configured to disable the supply of the internal power after the receiving of both the request signal and the disable signal in sequence.

7. The memory system according to claim 1, wherein the request signal is a PWRDIS signal sent from the host device.

8. The memory system according to claim 4, wherein the data saved during the second time period is not stored at the beginning of the first time period but is stored in the nonvolatile memory before the supply of the internal power from the power circuit is disabled in response to the request signal.

9. The memory system according to claim 1, further comprising:
    a second internal power line connecting the power circuit to the memory controller.

10. The memory system according to claim 1, wherein the first signal line is branched between the input connector and the memory controller such that a first branch connects to the memory controller and a second branch connects to the power circuit.

11. A memory system, comprising:
    a plurality of terminals of an input connector connectable to a host device;
    a nonvolatile memory for storing data;
    a memory controller connected to a first signal terminal in the plurality of signal terminals and configured to perform data operations on the nonvolatile memory in response to commands received via the plurality of terminals; and
    a power management integrated circuit connected to the first signal terminal, the power management integrated circuit configured to receive external power via a power terminal of the plurality terminals and generate internal power for the memory controller and the nonvolatile memory, wherein
    the memory controller is configured to:
        receive, via the first signal terminal, a power disable request signal for disabling supply of the internal power from the power management integrated circuit for a first time period after the power disable request signal is received, and
        cause the power management integrated circuit to disable the supply of the internal power in response to the power disable request signal once a second time period elapses after reception of the power disable request signal, the second time period being shorter than the first time period, and the power management integrated circuit is configured to resume the supply of the internal power after the first time period elapses after the reception of the power disable request signal at the first signal terminal.

12. The memory system according to claim 11, further comprising:
a first signal line connected to the first signal terminal and connecting the first signal terminal to the power management integrated circuit and the memory controller; and
a switching element on a portion of the first signal line between the first terminal and the power management integrated circuit, wherein
the memory controller is configured to open the switching element in an initial state before the reception of the power disable request signal and close the switching element after the second time period elapses after the power disable signal is received at the first signal terminal.

13. The memory system according to claim 11, further comprising:
an internal signal line connecting the memory controller to the power management integrated circuit, wherein
the memory controller is configured to transmit a disable signal, via the internal signal line, to the power management integrated circuit once the second period elapses after the reception of the power disable request signal, and
the power management integrated circuit is configured to disable the supply of the internal power upon receiving the disable signal.

14. The memory system according to claim 11, wherein
the power management integrated circuit has a first input terminal that is directly connected to the first signal terminal via a first signal line,
the memory controller is configured to transmit a disable signal to a second input terminal of the power management integrated circuit after the second period elapses after the reception of the request signal, and
the power management integrated circuit is configured to disable the supply of the internal power after the receiving of both the power disable request signal and the disable signal in sequence.

15. The memory system according to claim 11, wherein the power disable request signal is a PWRDIS signal sent from the host device to the first signal terminal.

16. A control method for a memory system including a nonvolatile memory, a memory controller, and a power management circuit that generates internal power to be supplied to the memory and the memory controller, the method comprising:
receiving a request signal at the memory controller from a host device, the request signal requesting the disabling of the supply of the internal power by the power management circuit for a first time period;
after a second time period, the second time period being shorter than the first time period, from reception of the request signal, outputting a control signal from the memory controller in response to the request signal to cause the power management circuit to disable the supply of the internal power; and
resuming the supply of the internal power from the power management circuit after the first time period elapses after the reception of the request signal.

17. The control method according to claim 16, wherein the request signal is a PWRDIS signal sent from a host device.

18. The control method according to claim 16, wherein the control signal is output to a switching element on a portion of a signal line connecting the power management circuit to a signal terminal receiving the request signal, the signal line also connecting the signal terminal to the memory controller.

19. The control method according to claim 16, wherein the control signal from the memory controller is output directly to a internal signal terminal of the power management circuit.

20. The control method according to claim 16, wherein the nonvolatile memory is NAND flash memory.

* * * * *